(12) United States Patent
Leschkies et al.

(10) Patent No.: US 9,385,239 B2
(45) Date of Patent: Jul. 5, 2016

(54) BUFFER LAYERS FOR METAL OXIDE SEMICONDUCTORS FOR TFT

(71) Applicant: Applied Materials, Inc., Santa Clara, CA (US)

(72) Inventors: Kurtis Leschkies, Santa Clara, CA (US); Steven Verhaverbeke, San Francisco, CA (US); Robert Visser, Menlo Park, CA (US); John M. White, Hayward, CA (US); Yan Ye, Saratoga, CA (US); Dong-Kil Yim, Santa Maria, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 108 days.

(21) Appl. No.: 14/203,433

(22) Filed: Mar. 10, 2014

(65) Prior Publication Data

US 2014/0264354 A1 Sep. 18, 2014

Related U.S. Application Data

(60) Provisional application No. 61/791,588, filed on Mar. 15, 2013.

(51) Int. Cl.
*H01L 29/786* (2006.01)
*H01L 29/49* (2006.01)

(52) U.S. Cl.
CPC ........ *H01L 29/7869* (2013.01); *H01L 29/4908* (2013.01)

(58) Field of Classification Search
CPC ................... H01L 21/02172; H01L 21/02189; H01L 21/022; H01L 29/7869; H01L 2924/13091
USPC ............................................................ 257/66
See application file for complete search history.

(56) References Cited

U.S. PATENT DOCUMENTS

| 6,097,038 | A | * | 8/2000 | Jinno | 257/57 |
| 8,350,261 | B2 | * | 1/2013 | Sakata et al. | 257/43 |
| 2008/0108229 | A1 | | 5/2008 | Tanaka et al. | |
| 2008/0303020 | A1 | * | 12/2008 | Shin et al. | 257/43 |
| 2009/0173944 | A1 | * | 7/2009 | Chen et al. | 257/66 |
| 2010/0065845 | A1 | | 3/2010 | Nakayama | |
| 2010/0117075 | A1 | * | 5/2010 | Akimoto et al. | 257/43 |
| 2011/0089416 | A1 | * | 4/2011 | Yamazaki et al. | 257/43 |
| 2012/0052636 | A1 | * | 3/2012 | Shin et al. | 438/151 |

FOREIGN PATENT DOCUMENTS

| KR | 10-2005-0025350 | 3/2005 |
| KR | 10-2012-0075423 | 7/2012 |

* cited by examiner

*Primary Examiner* — Allan R Wilson
(74) *Attorney, Agent, or Firm* — Patterson & Sheridan, LLP

(57) ABSTRACT

The present invention generally relates to a thin film semiconductor device having a buffer layer formed between the semiconductor layer and one or more layers. In one embodiment, a thin film semiconductor device includes a semiconductor layer having a first work function and a first electron affinity level, a buffer layer having a second work function greater than the first work function and a second electron affinity level that is less than the first electron affinity level; and a gate dielectric layer having a third work function less than the second work function and a third electron affinity level that is greater than the second electron affinity level.

18 Claims, 5 Drawing Sheets

BUFFER LAYERS FOR METAL OXIDE SEMICONDUCTORS FOR TFT

CROSS-REFERENCE TO RELATED APPLICATIONS

This application claims benefit of U.S. Provisional Patent Application Ser. No. 61/791,588, filed Mar. 15, 2013, which is herein incorporated by reference.

BACKGROUND OF THE INVENTION

1. Field of the Invention

Embodiments disclosed herein generally relate to buffer layers for thin film semiconductors. More specifically, embodiments disclosed herein generally relate to high work function and low electron affinity layers.

2. Description of the Related Art

Current interest in thin film transistors (TFTs) is particularly high because these devices may be used in liquid crystal active matrix displays (LCDs) of the kind often employed for computer and television flat panels. The LCDs may also contain light emitting diodes (LEDs), such as organic light emitting diodes (OLEDs) for back lighting. The LEDs and OLEDs require TFTs for addressing the activity of the displays. One of the applications for the semiconductor is for the thin-film transistor traditionally used for displays.

The current driven through the TFTs (i.e., the on-current) is limited by the channel material (often referred to as the active material, semiconductor material or semiconductor active material) as well as the channel width and length. Additionally, the turn-on voltage is determined by the accumulation of the carrier in the channel area of the semiconductor layer which could change as the shift of the fixed charge in the semiconductor material or the charge trapping in interfaces and the threshold voltage shifts after bias temperature stress or current temperature stress.

In current MO-TFTs, the interface between layers, such as the interface between the gate dielectric layer and the metal oxide semiconductor layer, can be problematic for the overall function of the device. In indium gallium zinc oxide (IGZO), zinc oxide (ZnO) and zinc oxynitride (ZnON) TFT devices, problems can include mobility problems and turn on voltages.

Therefore, there is a need in the art for methods and devices to reduce interface problems for TFT devices.

SUMMARY OF THE INVENTION

The present invention generally relates to a thin film semiconductor device having a buffer layer formed at the interface of the thin film semiconductor and one or more other layers. The buffer layers can have a high work function and a low electron affinity to prevent charge transfer between the semiconductor layer and the gate dielectric layer. As such, the use of one or more buffer layers can maintain the charge formed in the semiconductor layer and prevent increases in threshold voltage for the thin film semiconductor.

In one embodiment, a thin film semiconductor device can include a semiconductor layer having a first work function and a first electron affinity level, a buffer layer having a second work function greater than the first work function and a second electron affinity level that is less than the first electron affinity level and a gate dielectric layer having a third work function less than the second work function and a third electron affinity level that is greater than the second electron affinity level.

In another embodiment, a thin film semiconductor device can include a semiconductor layer having a first work function and a first electron affinity level, a buffer layer having a second work function greater than the first work function and a second electron affinity level that is less than the first electron affinity level; and a passivation layer having a third work function less than the second work function and a third electron affinity level that is greater than the second electron affinity level.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present embodiments generally relate to a thin film semiconductor device having multiple semiconductor layers. A buffer layer having a high work function and a low electron affinity can be deposited between the semiconductor layer and other layers. By inserting the buffer layer, mobility problems can be avoided and the threshold voltage of the gate can be maintained at a lower level. While description will be made with reference to a TFT, it is to be understood that the invention has broader utility, such as with any thin film semiconductor device.

Figure 1:
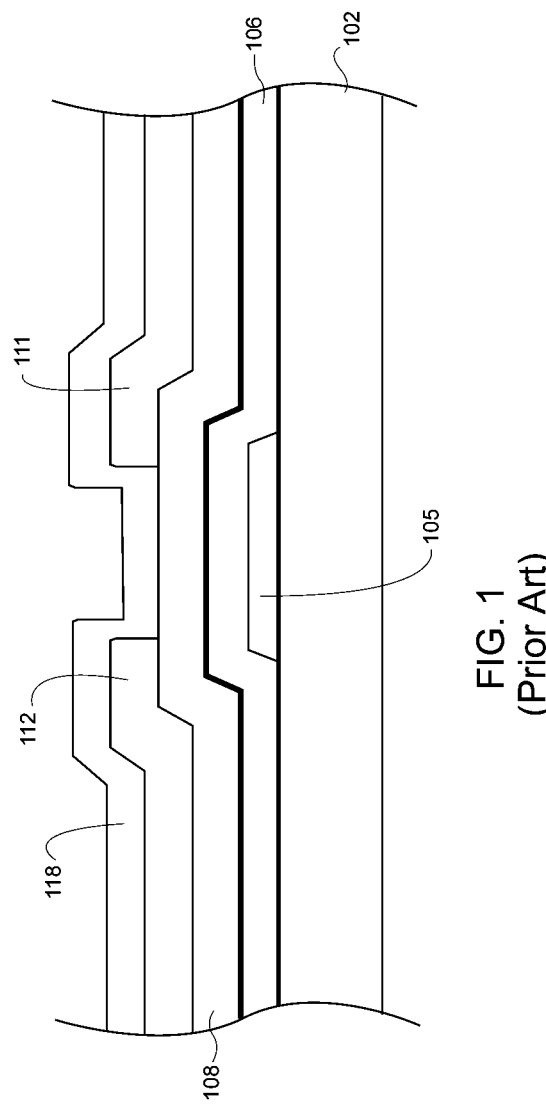
FIG. 1 is a depiction of a generic MO-TFT showing the gate dielectric layer and semiconductor layer interface.

FIG. 1 is a depiction of a generic MO-TFT. In this depiction, a substrate 102 has a stack deposited on the surface by various techniques such as PVD, CVD, PE-CVD or other techniques. The MO-TFT stack can be deposited on the substrate and can include a gate electrode 105, gate dielectric layer 106, a semiconductor layer 108, a source electrode 111, a drain electrode 112 and a passivation layer 118.

The interface between the gate dielectric layer 106 and the semiconductor layer 108 can be a source of problems. The work function is the energy difference between the Fermi level and the vacuum level. The Fermi level is a measurement of potential energy in a material, both chemical and electrical energy. When two materials are brought together, the Fermi levels will try to equilibrate and will cause a charge transfer from the shallow work function material to the deeper work function material.

When the semiconductor layer 108, such as ZnO or ZnON semiconductor layer forms an interface with the gate dielectric layer, such as intrinsic or undoped silicon, the different work functions can lead to charge accumulation in the deeper work function material. In the case of undoped silicon (which has a work function of 4.6 eV) and ZnO (which has a work function of 4.5 eV), charges transfer from the ZnO to the silicon at the interface. This charge transfer increases the threshold voltage of the gate. Further, the interface between the semiconductor layer 108 and gate dielectric layer 106 has many defects present as a result of bringing these two layers into intimate contact with each other. Consequently, charges can become trapped at this interface thereby accumulating within the semiconductor. This leads to lower charge mobility within the semiconductor layer 108, as well as large threshold voltages and off-currents in the TFT device. To address these problems and others, a buffer layer with a high work function and a low electron mobility can be placed between the two materials. The embodiments of the inventions disclosed herein are more clearly described with reference to the figures below.

The embodiments described below can be performed using a processing chamber, such as a plasma enhanced chemical vapor deposition (PECVD) system available from Applied Materials, Inc., located in Santa Clara, Calif. However, it should be understood that the embodiments disclosed herein are not limited to any particular chamber and can be performed in other chambers, including those sold by the same or other manufacturers.

Figure 2:
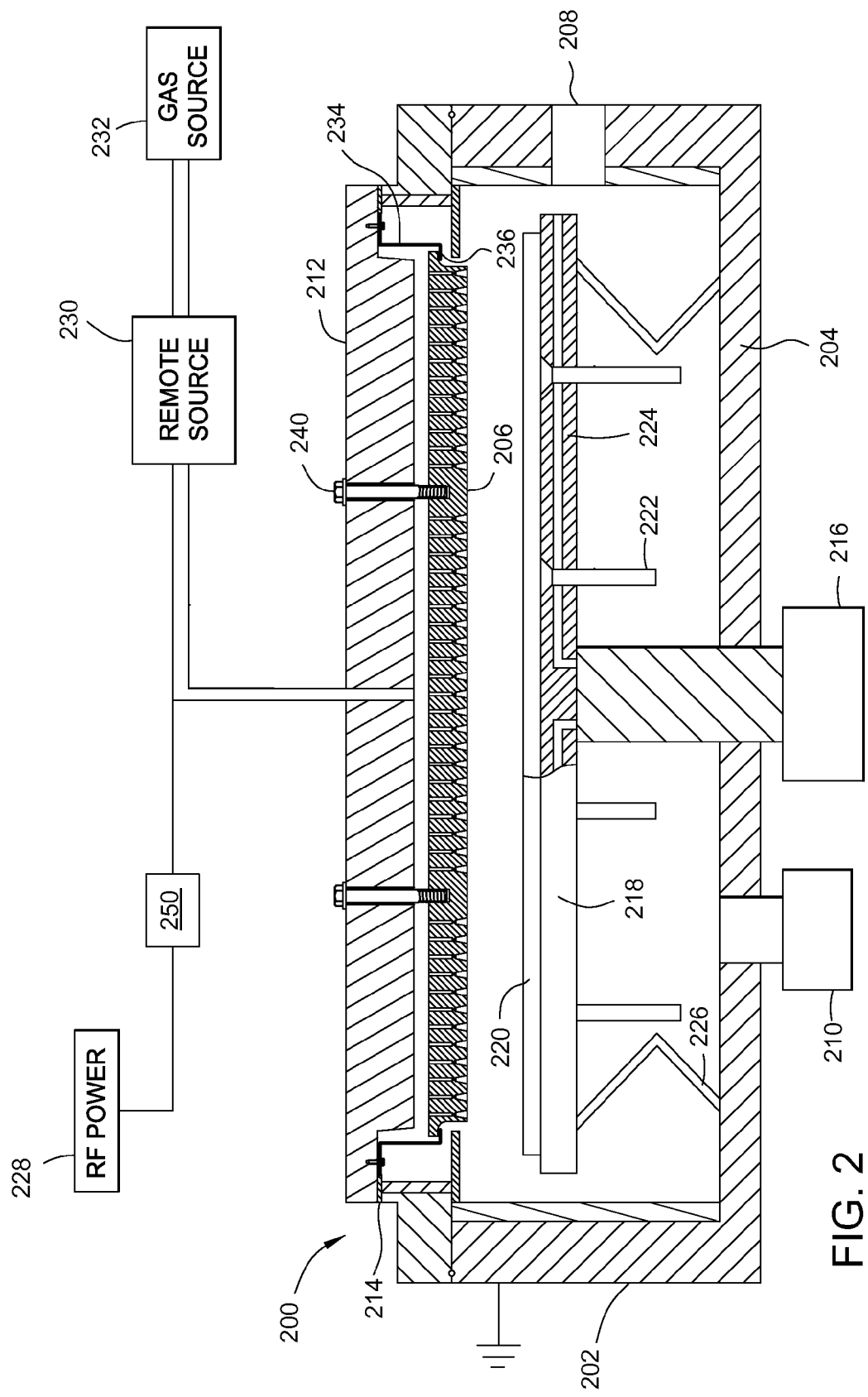
FIG. 2 is a schematic, cross sectional view of a process chamber that may be used to perform the operations described herein.

FIG. 2 is a schematic, cross sectional view of a process chamber that may be used to perform the operations described herein. The apparatus includes a chamber 200 in which one or more films may be deposited onto a substrate 220. The chamber 200 generally includes walls 202, a bottom 204 and a showerhead 206 which define a process volume. A substrate support 218 is disposed within the process volume. The process volume is accessed through a slit valve opening 208 such that the substrate 220 may be transferred in and out of the chamber 200. The substrate support 218 may be coupled to an actuator 216 to raise and lower the substrate support 218. Lift pins 222 are moveably disposed through the substrate support 218 to move a substrate to and from the substrate receiving surface. The substrate support 218 may also include heating and/or cooling elements 224 to maintain the substrate support 218 at a desired temperature. The substrate support 218 can also include RF return straps 226 to provide an RF return path at the periphery of the substrate support 218.

The showerhead 206 can be coupled to a backing plate 212 by a fastening mechanism 240. The showerhead 206 may be coupled to the backing plate 212 by one or more fastening mechanisms 240 to help prevent sag and/or control the straightness/curvature of the showerhead 206.

A gas source 232 can be coupled to the backing plate 212 to provide process gases through gas passages in the showerhead 206 to a processing area between the showerhead 206 and the substrate 220. The gas source 232 can include a silicon-containing gas supply source, an oxygen containing gas supply source, and a carbon-containing gas supply source, among others. Typical process gases useable with one or more embodiments include silane ($SiH_4$), disilane, $N_2O$, ammonia ($NH_3$), $H_2$, $N_2$ or combinations thereof.

A vacuum pump 210 is coupled to the chamber 200 to control the process volume at a desired pressure. An RF source 228 can be coupled through a match network 250 to the backing plate 212 and/or to the showerhead 206 to provide an RF current to the showerhead 206. The RF current creates an electric field between the showerhead 206 and the substrate support 218 so that a plasma may be generated from the gases between the showerhead 206 and the substrate support 218.

A remote plasma source 230, such as an inductively coupled remote plasma source 230, may also be coupled between the gas source 232 and the backing plate 212. Between processing substrates, a cleaning gas may be provided to the remote plasma source 230 so that a remote plasma is generated. The radicals from the remote plasma may be provided to chamber 200 to clean chamber 200 components. The cleaning gas may be further excited by the RF source 228 provided to the showerhead 206.

The showerhead 206 may additionally be coupled to the backing plate 212 by showerhead suspension 234. In one embodiment, the showerhead suspension 234 is a flexible metal skirt. The showerhead suspension 234 may have a lip 236 upon which the showerhead 206 may rest. The backing plate 212 may rest on an upper surface of a ledge 214 coupled with the chamber walls 202 to seal the chamber 200.

Figure 3A:
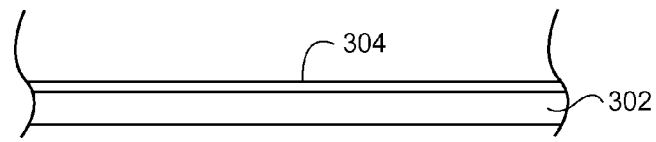
FIGS. 3A-3H are schematic illustrations of an MO-TFT according to one embodiment.

FIGS. 3A-3H are schematic illustrations of an MO-TFT according to one embodiment. As shown in FIG. 3A, the MO-TFT is fabricated by depositing a conductive layer 304 over a substrate 302. Suitable materials that may be utilized for the substrate 302 include but are not limited to glass, plastic, and semiconductor wafers. Suitable materials that may be utilized for the conductive layer 304 include but are not limited to chromium, molybdenum, copper, aluminum, tungsten, titanium, and combinations thereof, or transparent conductive oxides (TCO) such as indium tin oxide (ITO) or fluorine doped zinc oxide (ZnO:F) which are commonly used as transparent electrodes. The conductive layer 304 may be formed by physical vapor deposition (PVD) or other suitable deposition methods, such as electroplating, electroless plating or chemical vapor deposition (CVD).

Figure 3B:
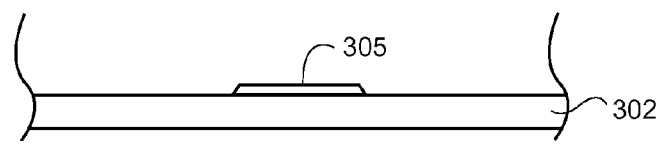

In FIG. 3B, the conductive layer 304 is patterned to form a gate electrode 305. The conductive layer 304 can be patterned by forming either a photolithographic mask or a hard mask over the conductive layer 304 and exposing the conductive layer 304 to an etchant. The conductive layer 304 may be patterned by exposing the exposed portions of the conductive layer 304 to a wet etchant or to an etching plasma. In one embodiment, the etching plasma can comprise gases selected from $SF_6$, $O_2$, $Cl_2$, or combinations thereof.

Figure 3C:
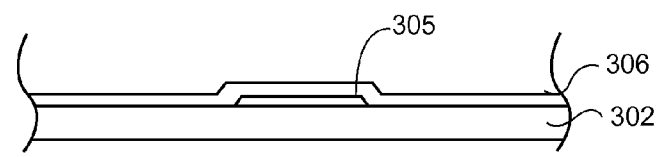

As shown in FIG. 3C, after the gate electrode 305 has been formed, a gate dielectric layer 306 is deposited thereover. The gate dielectric layer 306 can include SiOF, SiN, SiOx, and silicon oxynitride (SiON). Additionally, while shown as a single layer, it is contemplated that the gate dielectric layer 306 may comprise multiple layers, each of which may comprise a different chemical composition. Suitable methods for depositing the gate dielectric layer 306 include conformal deposition methods such as MW-PECVD, PECVD, CVD and atomic layer deposition (ALD).

Figure 3D:
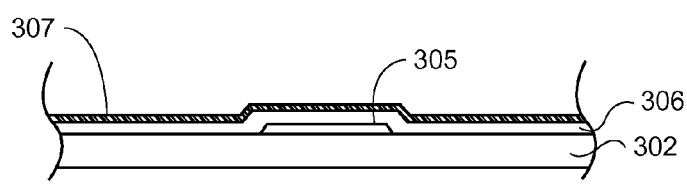
Figure 3E:
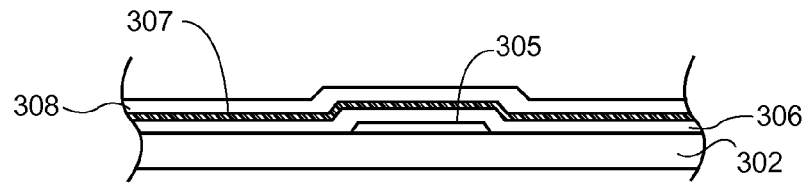

FIGS. 3D and 3E depict a buffer layer 307 formed over the gate dielectric layer 306 and a semiconductor layer 308 formed over the buffer layer 307. FIG. 3D depicts the buffer layer 307 deposited over the surface of the gate dielectric layer 306. The buffer layer 307 can be a layer with a high work function and a low electron affinity, as compared to a semiconductor layer 308 (described with reference to FIG. 3E). In one embodiment, the buffer layer 307 has an electron affinity of less than 4 eV. In another embodiment, the buffer layer 307 has a work function of greater than 5 eV. The buffer layer 307 can be of a thickness between 5 nm and 50 μm. Further embodiments, the buffer layer can be thicker than 50 μm. In one embodiment, the buffer layer 307 has a thickness of 5 nm. The buffer layer 307 can be deposited using CVD, PE-CVD, ALD, PVD or other known deposition techniques based on the material chosen and the available precursors. The buffer layer 307 can be relatively defect free with relation to both the interface between the gate dielectric layer 306 and the interface between the buffer layer 307 and the semiconductor layer 308. The buffer layer can be composed of a material which meets the above criteria, such as a p-type silicon (boron-doped silicon), vanadium oxide ($V_2O_5$), aluminum nitride (AlN), tungsten nitride, other metal oxides or metal nitrides, or combinations thereof. $V_2O_5$ has a high work function of approximately 5.6 eV, an electron affinity of approximately 2.3 eV and forms a nearly defect free interface with ZnO.

As shown in FIG. 3E, the semiconductor layer 308 is deposited over the buffer layer 307. Suitable materials that may be used for the semiconductor layer 308 include IGZO, ZnO, ZnON and others. The semiconductor layer 308 may be deposited by suitable deposition methods such as PVD. In one embodiment, the PVD may comprise applying a DC bias to a rotary cathode.

Figure 3F:
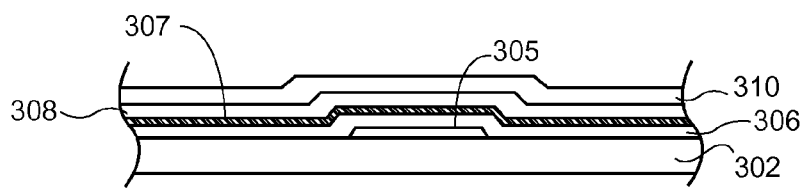
Figure 3G:
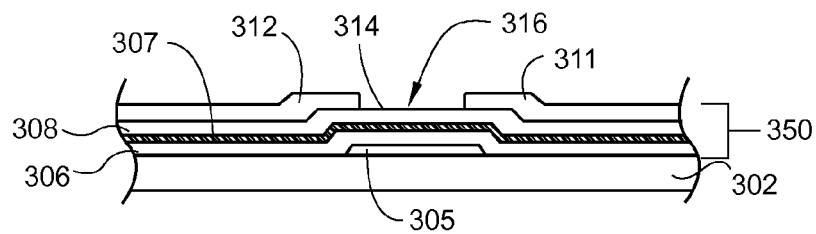

As shown in FIGS. 3F and 3G, a conductive layer 310 may be deposited over the semiconductor layer 308. The conductive layer 310 may be formed by PVD or other suitable deposition methods such as electroplating, electroless plating or CVD. In FIG. 3F, the conductive layer 310 is patterned to form a source electrode 311 and a drain electrode 312 by a back channel etch process. The patterning may occur by forming either a photolithographic mask or a hard mask over the conductive layer 310 and exposing the exposed portions of the conductive layer 310 to an etchant. The conductive layer 310 may be patterned by exposing the exposed portions of the conductive layer 310 to a wet etchant or to an etching plasma. In one embodiment, the conductive layer 310 may be patterned by etching areas of the conductive layer 310 that are not covered by a mask with an etching plasma comprising etchants such as $SF_6$, $O_2$, and combinations thereof. In forming the source electrode 311 and the drain electrode 312, a portion of the semiconductor layer 308 is exposed creating an exposed portion 314. The exposed portion 314 is between the source electrode 311 and drain electrode 312. The area between the source electrode 311 and drain electrode 312 is referred to as the active channel 316. The combined gate electrode 305, the gate dielectric layer 306, the semiconductor layer 308, the source electrode 311 and the drain electrode 312 are referred to herein as the metal oxide thin film transistor (MO-TFT) layer 350.

Figure 3H:
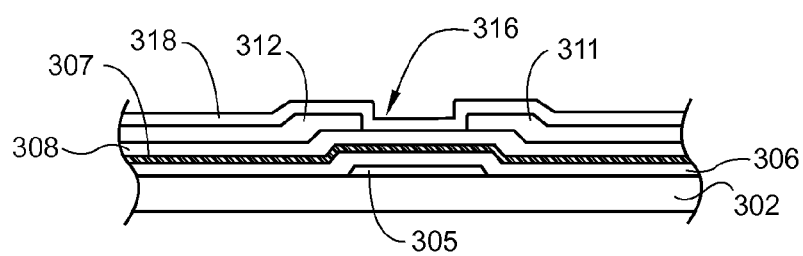

In FIG. 3H, a passivation layer 318 is deposited over the active channel 316, the source electrode 311 and drain electrode 312. In one embodiment, the passivation layer 318 that is in contact with the exposed portion 314 of the semiconductor layer 308 is a metal oxide or metal nitride, such as SiO, SiN, SiON or combinations thereof. The passivation layer 318 can be deposited to a thickness of from 20 Å to 3000 Å. The passivation layer 318 can be deposited using CVD, PECVD, ALD or other deposition techniques known in the art. using Deposition gases for depositing the passivation layer 318 can include silanes, such as $SiH_4$, $N_2O$, $O_2$, $N_2$, an inert carrier gas or combinations thereof. As depicted, the deposition of the passivation layer 318 is substantially conformal across the surface of the active channel 316, the source electrode 311 and drain electrode 312. Further, the passivation layer 318 can be composed of one or more layers including, inorganic layers (including embodiments described above), organic layers, or combinations thereof.

Figure 4:
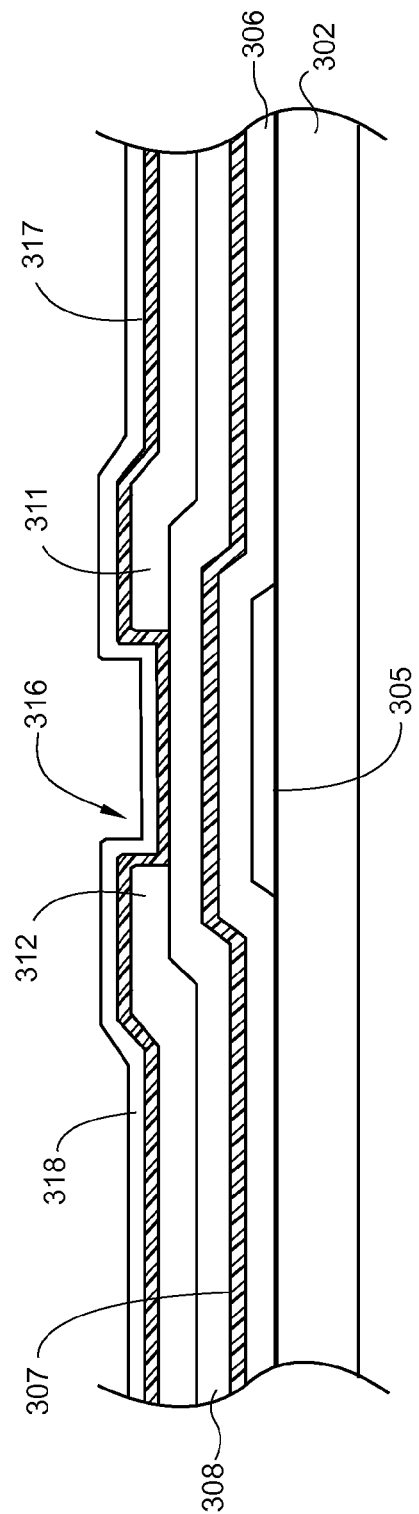
FIG. 4 is a MO-TFT incorporating a buffer layer according to one embodiment.

FIG. 4 is a MO-TFT incorporating one or more buffer layers according to one embodiment. In this depiction, the substrate 302 has the stack described with reference to FIGS. 3A-H including the gate electrode 305, the gate dielectric layer 306, the buffer layer 307, the semiconductor layer 308, a source electrode 311, a drain electrode 312 and the passivation layer 318. In this embodiment, a second buffer layer 317 has been deposited over the semiconductor layer 308, the source electrode 311, and the drain electrode 312. The second buffer layer 317 acts to prevent the interface between the passivation layer 318 and the semiconductor layer 308. Much in the same way that the gate dielectric layer 306 can receive charge from the semiconductor layer 308, the second buffer layer 317 can receive charge from the semiconductor layer 308.

The second buffer layer 317 should have similar characteristics to that of the buffer layer 307, with consideration that the second buffer layer 317 will have a higher work function and a lower electron affinity than the material which creates the interface between the passivation layer 318 and the semiconductor layer 308. Stated another way, if the passivation layer 318 is composed of a first silicon containing layer, an organic layer and a second silicon containing layer, where the first silicon containing layer is in contact with the semiconductor layer 308, the buffer layer 307 should have a higher work function and a lower electron affinity than the first silicon containing layer. Thus by eliminating the defective interface, the electrons can be maintained in the semiconductor.

Either the buffer layer 307 or the second buffer layer 317 can be composed of one or more layers, so long as each of the layers of the buffer layer 307 or the second buffer layer 317 have a higher work function, a lower electron affinity and form a defect free or nearly defect free interface with the layers that they contact.

While the foregoing is directed to embodiments of the present invention, other and further embodiments of the invention may be devised without departing from the basic scope thereof, and the scope thereof is determined by the claims that follow.

The invention claimed is:

1. A thin film semiconductor device, comprising:
   a gate electrode disposed over a substrate;
   a gate dielectric layer disposed over the gate electrode, the gate dielectric layer having a third work function, the third work function being less than a second work function;
   a buffer layer disposed over the gate dielectric layer, the buffer layer having the second work function, the second work function being greater than a first work function, and a second electron affinity level that is less than a first electron affinity level;
   a semiconductor layer disposed over the buffer layer, the semiconductor layer having the first work function and the first electron affinity level;
   a source electrode disposed over the semiconductor layer; and
   a drain electrode disposed over the semiconductor layer.

2. The thin film semiconductor device of claim 1, wherein a second buffer layer formed over the semiconductor layer, the source electrode and the drain electrode.

3. A thin film semiconductor device, comprising:
   a semiconductor layer having a first work function and a first electron affinity level, the semiconductor layer on a buffer layer;
   the buffer layer having a second work function greater than the first work function and a second electron affinity level that is less than the first electron affinity level, wherein the buffer layer comprises a p-type silicon, the buffer layer on a gate dielectric layer; and the gate dielectric layer having a third work function less than the second work function.

4. The thin film semiconductor device of claim 1, wherein the buffer layer has an electron affinity of less than 4 eV.

5. The thin film semiconductor device of claim 1, wherein the buffer layer has a work function of greater than 5 eV.

6. The thin film semiconductor device of claim 1, wherein the buffer layer comprises a boron-doped silicon, $V_2O_5$, AlN, WN or combinations thereof.

7. A thin film semiconductor device, comprising:
a gate electrode disposed over a substrate;
a gate dielectric layer disposed over the gate electrode;
a buffer layer disposed over the gate dielectric layer, the buffer layer having a second work function, the second work function being greater than a first work function, and a second electron affinity level that is less than a first electron affinity level;
a semiconductor layer disposed over the buffer layer, the semiconductor layer having the first work function and the first electron affinity level;
a source electrode disposed over the semiconductor layer;
a drain electrode disposed over the semiconductor layer; and
a passivation layer disposed over the source electrode, the drain electrode and the semiconductor layer, the passivation layer having a third work function less than the second work function.

8. A thin film semiconductor device, comprising:
a semiconductor layer having a first work function and a first electron affinity level;
a buffer layer having a second work function greater than the first work function and a second electron affinity level that is less than the first electron affinity level, wherein the buffer layer comprises a p-type silicon; and
a passivation layer having a third work function less than the second work function.

9. The thin film semiconductor device of claim 7, wherein the buffer layer comprises a boron-doped silicon, $V_2O_5$, AlN, WN or combinations thereof.

10. The thin film semiconductor device of claim 7, wherein the buffer layer has an electron affinity of less than 4 eV.

11. The thin film semiconductor device of claim 7, wherein the buffer layer has a work function of greater than 5 eV.

12. The thin film semiconductor device of claim 7, wherein the buffer layer is composed of a plurality of layers.

13. The thin film semiconductor device of claim 7, wherein the passivation layer is composed of a plurality of layers.

14. A thin film semiconductor device, comprising:
a semiconductor layer having a first work function and a first electron affinity level, the semiconductor layer on a buffer layer;
the buffer layer having a second work function greater than the first work function and a second electron affinity level that is less than the first electron affinity level, the buffer layer on a passivation layer; and
the passivation layer having a third work function less than the second work function wherein the passivation layer comprises both organic and inorganic layers.

15. A thin film semiconductor device, comprising:
a gate electrode disposed over a substrate;
a gate dielectric layer disposed over the gate electrode, the gate dielectric layer having a third work function less than a second work function;
a p-type silicon buffer layer disposed over the gate dielectric layer, the p-type silicon buffer layer having the second work function greater than the first work function and a second electron affinity level that is less than the first electron affinity level;
a semiconductor layer disposed over the p-type silicon buffer layer, the semiconductor layer having a first work function and a first electron affinity level;
a source electrode disposed over the semiconductor layer; and
a drain electrode disposed over the semiconductor layer.

16. The thin film semiconductor device of claim 15, wherein a second buffer layer formed over the semiconductor layer, the source electrode and the drain electrode.

17. The thin film semiconductor device of claim 16, wherein the second buffer layer comprises a p-type silicon.

18. A thin film semiconductor device, comprising:
a semiconductor layer having a first work function and a first electron affinity level, the semiconductor layer on a buffer layer;
the buffer layer having a second work function greater than the first work function and a second electron affinity level that is less than the first electron affinity level, the buffer layer on a passivation layer; and
the passivation layer having a third work function less than the second work function, wherein the passivation layer comprises both organic and inorganic layers.

* * * * *